United States Patent
Do et al.

(10) Patent No.: US 7,349,272 B2
(45) Date of Patent: Mar. 25, 2008

(54) MULTI-PORT SEMICONDUCTOR MEMORY DEVICE

(75) Inventors: Chang-Ho Do, Kyoungki-do (KR); Jae-Jin Lee, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/541,236

(22) Filed: Sep. 28, 2006

(65) Prior Publication Data
US 2007/0070743 A1    Mar. 29, 2007

(30) Foreign Application Priority Data
Sep. 29, 2005    (KR) .................. 10-2005-0090917
Apr. 11, 2006    (KR) .................. 10-2006-0032946

(51) Int. Cl.
*G11C 11/00*    (2006.01)
(52) U.S. Cl. .................. 365/201; 365/230.06
(58) Field of Classification Search ............. 365/201, 365/230.06
See application file for complete search history.

(56) References Cited
U.S. PATENT DOCUMENTS

| | | | |
|---|---|---|---|
| 5,742,557 A | 4/1998 | Gibbins et al. | |
| 5,796,745 A | 8/1998 | Adams et al. | |
| 5,896,330 A | 4/1999 | Gibson | |
| 6,122,218 A | 9/2000 | Kang | |
| 6,288,969 B1 | 9/2001 | Gibbins et al. | |
| 6,594,196 B2 | 7/2003 | Hsu et al. | |
| 6,845,429 B2 | 1/2005 | Mattausch et al. | |
| 6,961,269 B2* | 11/2005 | Royer | 365/189.01 |
| 6,992,937 B2* | 1/2006 | Tran et al. | 365/200 |
| 7,057,948 B2* | 6/2006 | Shimizu et al. | 365/200 |
| 2002/0146025 A1 | 10/2002 | Okina | |
| 2003/0151962 A1* | 8/2003 | Tomizawa et al. | 365/201 |
| 2004/0213060 A1* | 10/2004 | Naso et al. | 365/201 |
| 2005/0073890 A1* | 4/2005 | Smith et al. | 365/201 |
| 2005/0162948 A1* | 7/2005 | Swanson et al. | 365/201 |
| 2005/0249018 A1 | 11/2005 | Lee et al. | |
| 2005/0251713 A1 | 11/2005 | Lee | |
| 2007/0070778 A1 | 3/2007 | Do | |

FOREIGN PATENT DOCUMENTS

JP    2002-230977    8/2002

* cited by examiner

*Primary Examiner*—Michael T Tran
(74) *Attorney, Agent, or Firm*—Blakely, Sokoloff, Taylor & Zafman

(57) ABSTRACT

A semiconductor memory device includes: a plurality of ports configured to perform a serial input/output (I/O) data communication with external devices; a plurality of banks configured to perform a parallel I/O data communication with the ports; a global data bus configured to transmit a signal between the banks and the ports; a test mode determiner configured to determine an operation mode of the semiconductor memory device by generating a test mode enable signal in response to a test mode control signal; a test I/O controller configured to transmit and receive a test signal with the ports in response to the test mode enable signal during a port test mode; and a plurality of selectors, each of which is configured to receive the test signal output from the corresponding port in series and feedback the test signal to the corresponding port.

91 Claims, 11 Drawing Sheets

PRXi

PTXi

MULTI-PORT SEMICONDUCTOR MEMORY DEVICE

FIELD OF THE INVENTION

The present invention relates to a semiconductor memory device, and more particularly to a semiconductor memory device including a plurality of ports for transmitting information with external devices.

DESCRIPTION OF RELATED ARTS

Most memory devices such as a random access memory (RAM) include only one port for transmitting data with external chipsets. The port is constituted with a plurality of input/output (I/O) pins. The memory device including single port employs a parallel I/O interface for concurrently transmitting multi-bit data through a plurality of data lines connected to the plurality of I/O pins respectively. The I/O interface uses a data transmission scheme for transmitting data via data lines, each of which is connected between two devices. The data line uses a bus for transmitting signals such as an address signal, a data signal, and a control signal.

The parallel I/O interface provides a high data process speed because it can simultaneously transmit multi-bit data through a plurality of data lines. Therefore, the parallel I/O interface is widely used in a short distance transmission that requires a high speed. However, because a large number of buses are included for the parallel I/O interface, a data transmission cost increases when the data transmission is performed between long distance. Due to the limitation of the single port, a plurality of memory devices is independently configured so as to support various multi-media functions in terms of hardware of a multi-media system. While an operation for a certain function is carried out, an operation for another function cannot be concurrently carried out. Considering the disadvantage of the parallel I/O interface, many attempts to change the parallel I/O interface into serial I/O interface have been made. Also, considering compatible expansion with devices having other serial I/O interfaces, the change to serial I/O interface in I/O environment of the semiconductor memory device is required. Moreover, appliance devices for audio and video are embedded into display devices, such as a high definition television (HDTV) and a liquid crystal display (LCD) TV. Because these appliance devices require independent data processing, there is a demand for multi-port memory devices having a serial I/O interface using a plurality of ports.

A conventional multi-port memory device having a serial I/O interface includes a processor for processing serial I/O signals, and a DRAM core for performing a parallel low-speed operation. The processor and the DRAM core are implemented on the same wafer, that is, a single chip.

FIG. 1 is block diagram of a conventional semiconductor memory device including a serial I/O interface.

As shown, the semiconductor memory device includes two ports PORT0 and PORT1 and four banks BANK0 to BANK3. Each port is connected to a plurality of serial I/O pads, e.g., TX0+, TX0−, RX0+, and RX0−. Each of the ports PORT0 and PORT1 and each of the banks BANK0 to BANK3 in the semiconductor memory device are connected via a global data bus. The global data bus includes reception buses PRX0<0:3> and PRX1<0:3> and transmission buses PTX0<0:3> and PTX1<0:3>. The reception buses PRX0<0:3> and PRX1<0:3> transmit a data signal from a corresponding port to a corresponding bank. The transmission buses PTX0<0:3> and PTX1<0:3> transmit a data signal from a corresponding bank to a corresponding port. The reception bus, e.g., PRX0<0:3>, can transmit a parallel data signal output from a corresponding port, e.g., PORT0, to every bank BANK0 to BANK3. The transmission bus, e.g., PTX0<0:3>, transmits a parallel data signal output from every bank BANK0 to BANK3 to a corresponding port, e.g., PORT0.

The data signal output from the port, e.g., PORT0, includes information designating a destination out of the banks BANK0 to BANK3 and second ports PORT0 and PORT1. Therefore, signals indicating which ports the signals access and which banks access through the ports are inputted to the first to fourth banks BANK0 to BANK3. Accordingly, the port information is selectively transferred to the banks and the bank information is transferred to the first and second ports PORT0 and PORT1 via the global I/O data buses.

The ports PORT0 and PORT1 respectively include a serializer/deserializer (SERDES) device. A deserializer included in the SERDES device converts the data signal serially input from the serial reception I/O pads RX+ and RX− to a parallel format and transmits the data signal in parallel to a core area of the corresponding bank via the reception buses PRX0<0:3> and PRX1<0:3>. A serializer included in the SERDES device converts the data signal input from the core area to a serial format.

FIG. 2 is a block diagram of the port shown in FIG. 1.

As shown, the port, e.g., PORT0, communicates with an external device by employing a serial I/O interface via the serial I/O pads, e.g., TX0+, TX0−, RX0+, and RX0−. The data signals input from the serial reception I/O pads RX+ and RX− and output to the serial transmission I/O pads TX+ and TX− are serial signals of a high speed. Generally, the high speed signal includes differential signals for smooth data recognition. The differential signals are distinguished by indicating the serial I/O pads TX0+, TX0−, RX0+ and RX0− with "+" and "−".

The port, e.g., PORT0, includes a driver 21, a serializer 22, an input latch 23, a clock generator 24, a sampler 25, a deserializer 26, and an output unit 27.

The driver 21 outputs the data signal serialized by the serializer 22 to an external device through the serial transmission I/O pads TX0+ and TX0− in a differential type. The serializer 22 serializes the data signal in parallel format input from the input latch 23 in synchronism with the internal clock and outputs the data signal in serial format to the driver 21. The input latch 23 latches the data signal outputted via the transmission bus PTX0<0:3> from the banks in synchronism with the internal clock and transmits the latched signals to the serializer 22. The sampler 25 samples data signal input from the external device through the serial reception I/O pads RX0+ and RX0− in synchronism with the internal clock and transmits the sampled signal to the deserializer 26. The deserializer 26 parallelizes the external signals input from the sampler 25 in synchronism with the internal clock and outputs the parallel data signal to the output unit 27. The output unit 27 transmits the data signal from the deserializer 26 to the banks via the reception bus PRX0<0:3>. The clock generator 24 receives a reference clock RCLK from the external device to generate an internal clock. In some case, the internal clock has the same period and phase as the reference clock RCLK. In other case, the internal clock is generated by modifying the period or the phase of the reference clock RCLK. Further, the clock generator 24 can generate a single internal clock or generate a plurality of internal clocks which have various periods and phases.

The other port PORT1 included in the semiconductor memory device shown in FIG. 1 has the same structure with that of the port PORT0 shown in FIG. 2.

An operation of the ports, e.g., PORT0, will be described below in detail.

First, a process of deserializing the data signal and transmitting the parallel data signal via the reception bus PRX0<0:3> will be described. The data signal from the external device is input through the reception pads RX0+ and RX0− in a frame format at high speed.

The external signals are sampled through the sampler 25 in synchronism with the internal clock output from the clock generator 24. The sampler 25 transmits the sampled data signal to the deserializer 26. The deserializer 26 deserializes the data signal input from the sampler 25 in synchronism with the internal clock and outputs the deserialized data signal as the parallel data signal to the output unit 27. The output unit 27 transmits the parallel data signal to the banks via the reception bus PRX0<0:3>.

Next, a process of serializing the parallel data signal output via the transmission bus PTX0<0:3> and transmitting the serial data signal to the external devices through the serial transmission I/O pads TX0+ and TX0− will be described below.

The parallel data signal are transmitted to the input latch 23 via the transmission bus PTX0<0:3>. The input latch 23 latches the data signal in synchronism with the internal clock and transmits the latched signal to the serializer 22. The serializer 22 serializes the data signal transmitted from the input latch 23 in synchronism with the internal clock to transmit the serialized data signal to the driver 21. The driver 21 outputs the serialized data signal to the external devices through the serial transmission I/O pads TX0+ and TX0−.

As described above, the conventional semiconductor memory device includes the ports performing the data communication with the external devices in the high-speed serial I/O interface and converting the data signal into serial/parallel format. Such ports are essential for the semiconductor memory device to concurrently perform several functions with the external devices. Accordingly, it is important to detect a performance error of the ports for reliable operation of the semiconductor memory device and the system including it.

SUMMARY OF THE INVENTION

Embodiments of the present invention are directed to a semiconductor memory device for reliably performing a data communication with external devices through a plurality of ports.

In accordance with an aspect of the present invention, there is provided a semiconductor memory device including: a plurality of ports, a plurality of banks, a global data bus, a test mode determiner, a test input/output (I/O) controller; and a plurality of selectors. The ports perform a serial I/O data communication with external devices. The banks perform a parallel I/O data communication with the ports. The global data bus transmits a signal between the banks and the ports. The test mode determiner determines an operation mode of the semiconductor memory device by generating a test mode enable signal in response to a test mode control signal. The test I/O controller transmits and receives a test signal with the ports in response to the test mode enable signal during a port test mode. Each of the selectors receives the test signal output from the corresponding port in series and feedback the test signal to the corresponding port. The operation mode includes the port test mode for testing an operation of the ports and a normal operation mode for data communication between the external devices and the banks.

In accordance with another aspect of the present invention, there is provided a semiconductor memory including a plurality of first pads, a plurality of second pads, a plurality of ports, a plurality of banks, a first and a second data bus, a test mode determiner, a test I/O controller, and a plurality of selectors. The first pads provide a serial I/O data communication. The second pads provide a parallel I/O data communication. The ports perform the serial I/O data communication with external devices. The banks perform the parallel I/O data communication with the ports. The first data bus transmits a first signal from the ports to the banks. The second data bus transmits a second signal from the banks to the ports. The test mode determiner generates a test mode enable signal and a port selection signal in response to a test mode control signal. The test I/O controller transmits and receives a test signal with the ports in response to the test mode enable signal during a port test mode. Each of the selectors receives the test signal output from the corresponding port in series and feeds back the test signal to the corresponding port in response to the port selection signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a delay locked loop (DLL) device in accordance with the present invention will be described in detail referring to the accompanying drawings.

Figure 3:
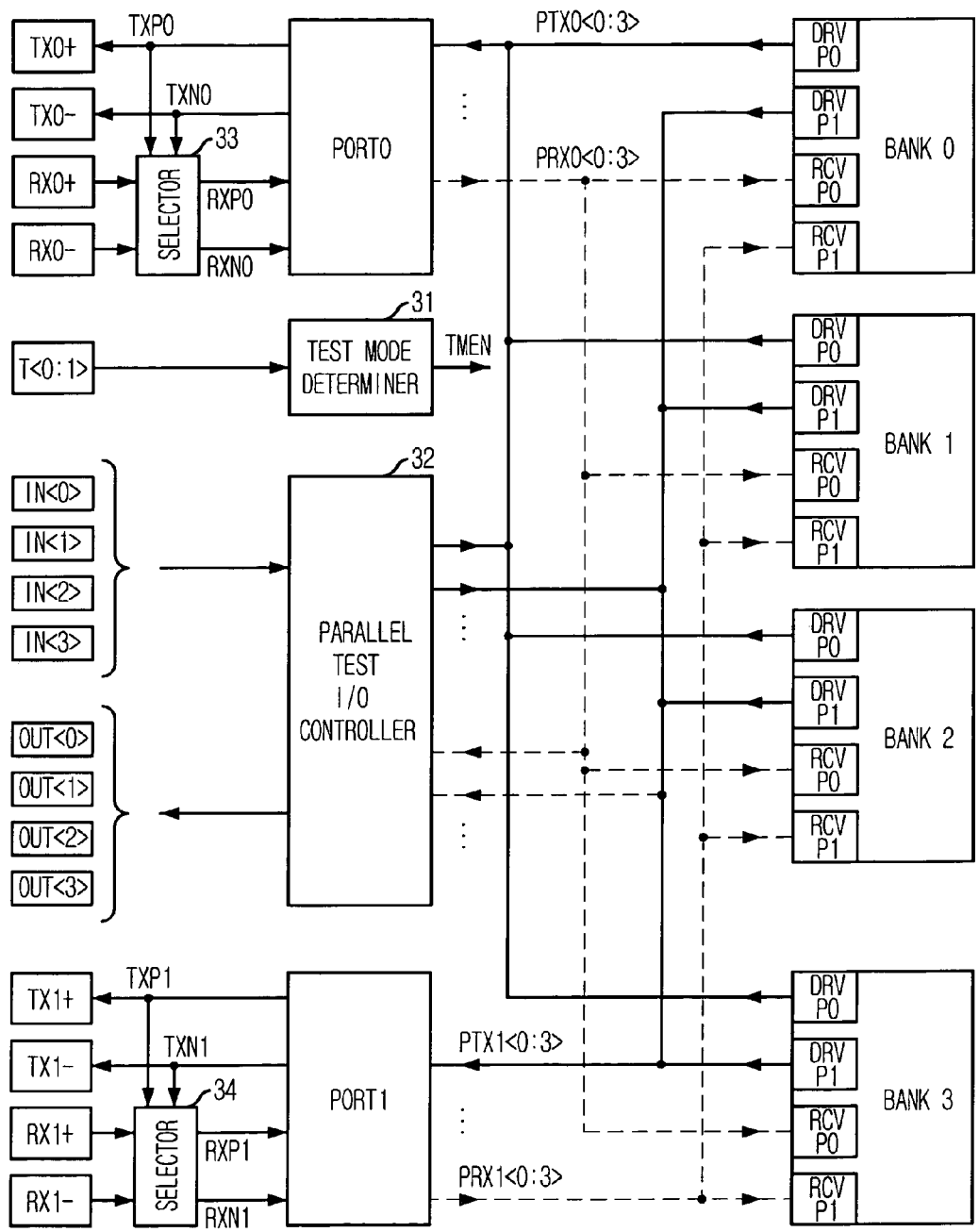
FIG. 3 is a block diagram of the semiconductor memory device in accordance with an embodiment of the present invention.

FIG. 3 is a block diagram of the semiconductor memory device in accordance with an embodiment of the present invention.

As shown, the semiconductor memory device includes two ports PORT0 and PORT1, four banks BANK0 to BANK3, a plurality of serial input/output (I/O) pads TX0+, TX0−, RX0+, RX0−, TX1+, TX1−, RX1+, and RX1−, a plurality of parallel I/O pads IN<0:3>, T<0:1>, and OUT<0:3>. The semiconductor memory device further includes a test mode determiner 31 and a parallel test I/O controller 32.

The serial I/O pads TX0+, TX0−, RX0+, RX0−, TX1+, TX1−, RX1+, and RX1− are used for communication between external devices and the ports PORT0 and PORT1 at a high speed. The serial I/O pads includes serial transmission I/O pads TX0+, TX0−, TX1+ and TX1− for transmitting a serial output data signal output from the ports PORT0 and PORT1 to the external devices at a high speed and serial reception I/O pads RX0+, RX0−, RX1+, and RX1− for transmitting a serial input data signal from the external devices to the ports PORT0 and PORT1 at a high speed.

The parallel I/O pads includes test reception pads IN<0:3>, test transmission pads OUT<0:3>, and a test control pad T<0:1>. The test reception pads IN<0:3> transmits a parallel test input signal from an external test device to the parallel test I/O controller 32. The test transmission pads OUT<0:3> transmits a parallel test output signal from the parallel test I/O controller 32 to the external test device. The test control pad T<0:3> transmits a parallel test control signal from the external test device to the test mode determiner 31. The number of the test reception pads IN<0:3> and the test transmission pads OUT<0:3> can be varied. In case shown in FIG. 3, 4 bit data is transmitted via the test reception pads IN<0:3> and the test transmission pads OUT<0:3>. The test control pad T<0:1> can be replaced with a serial I/O pad. The test control signal can be directly input to the parallel test I/O controller 32 and, in this case, the test control pad T<0:1> can be removed.

The test mode determiner 31 determines an operation mode of the semiconductor memory device out of a normal operation mode and a port test mode in response to the test control signal. The test mode determiner 31 decodes the test control signal and generates a test mode enable signal TMEN. Further, the test mode determiner 31 generates port selection signal TMEN_P0 and TMEN_P1 for selecting a target port out of the ports PORT0 and PORT1 which will be tested. The test mode enable signal TMEN is activated as a logic high level during a test mode. In some embodiments, the test mode enable signal TMEN can be generated by logically combining the port selection signal TMEN_P0 and TMEN_P1.

The parallel test I/O controller 32 activated by the test mode enable signal TMEN transmits the test input signal input through the test reception pads IN<0:3> to transmission bus PTX0<0:3> or PTX1<0:3> and outputs the test output signal from reception bus PRX0<0:3> or PRX1<0:3> through the test transmission pads OUT<0:3>. The test output signal is generated by the corresponding bank in response to the corresponding test input signal. The transmission buses PTX0<0:3> and PTX1<0:3> and the reception buses PRX0<0:3> or PRX1<0:3> are global buses connected between ports PORT0 and PORT1 and the banks BANK0 to BANK3.

Figure 4:
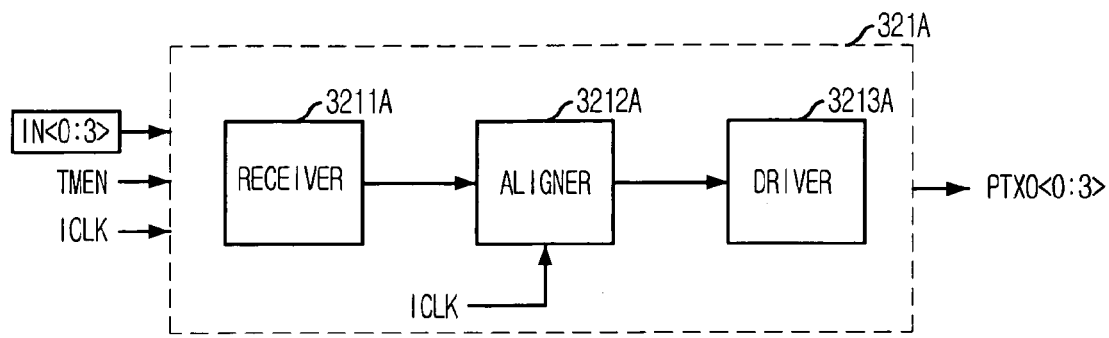
FIG. 4 is a block diagram of a parallel test I/O controller shown in FIG. 3 in accordance with an embodiment of the present invention.
Figure 4:
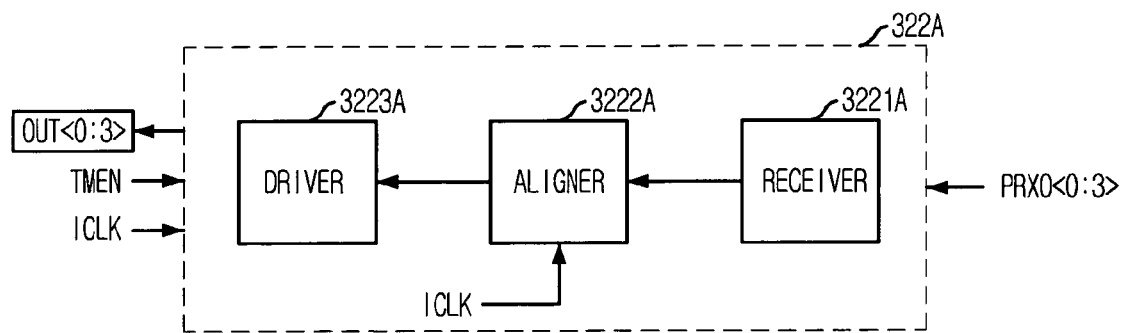

FIG. 4 is a block diagram of the parallel test I/O controller 32A shown in FIG. 3 in accordance with an embodiment of the present invention.

Figure 1:
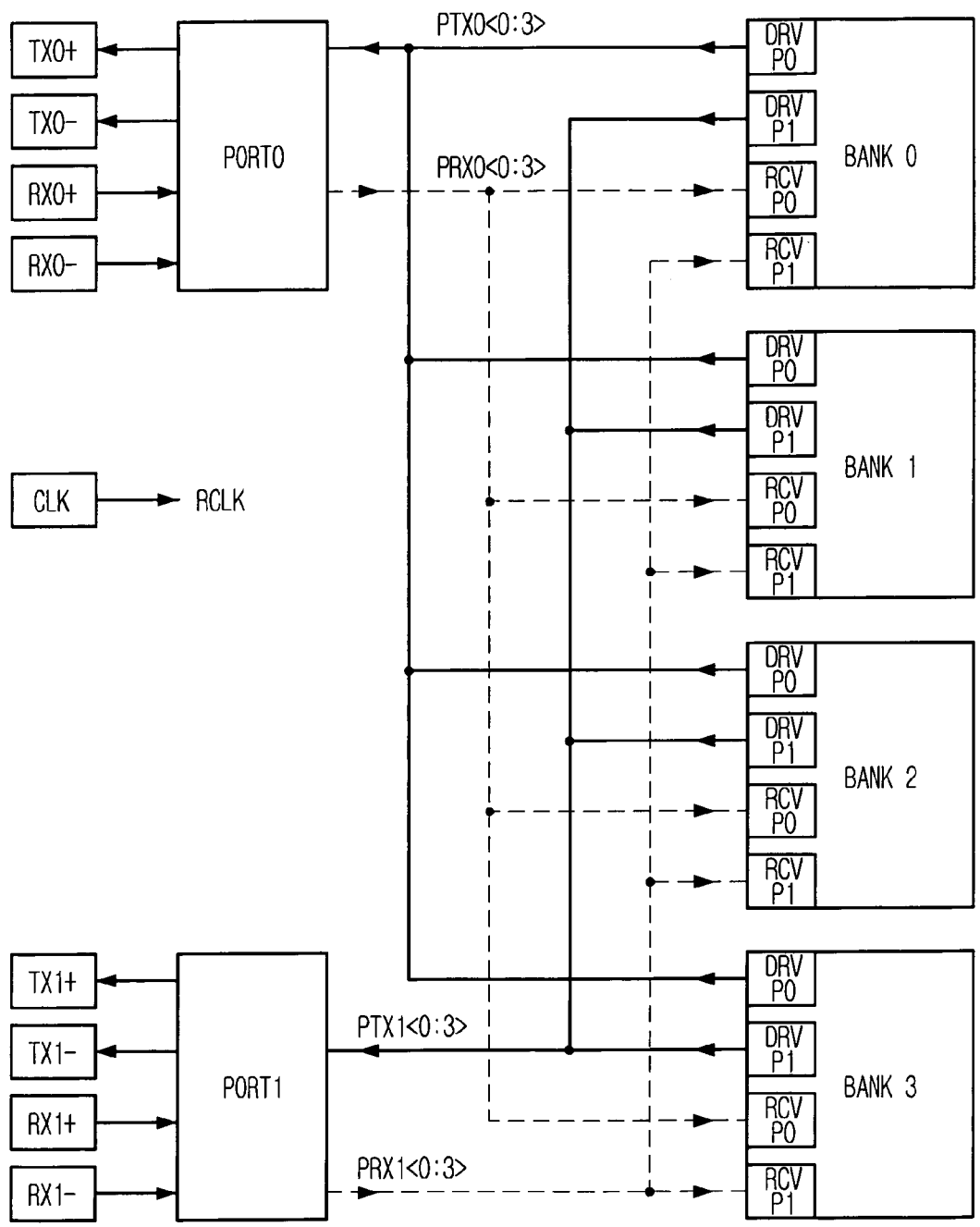
FIG. 1 is block diagram of a conventional semiconductor memory device including a serial I/O interface.
Figure 2:
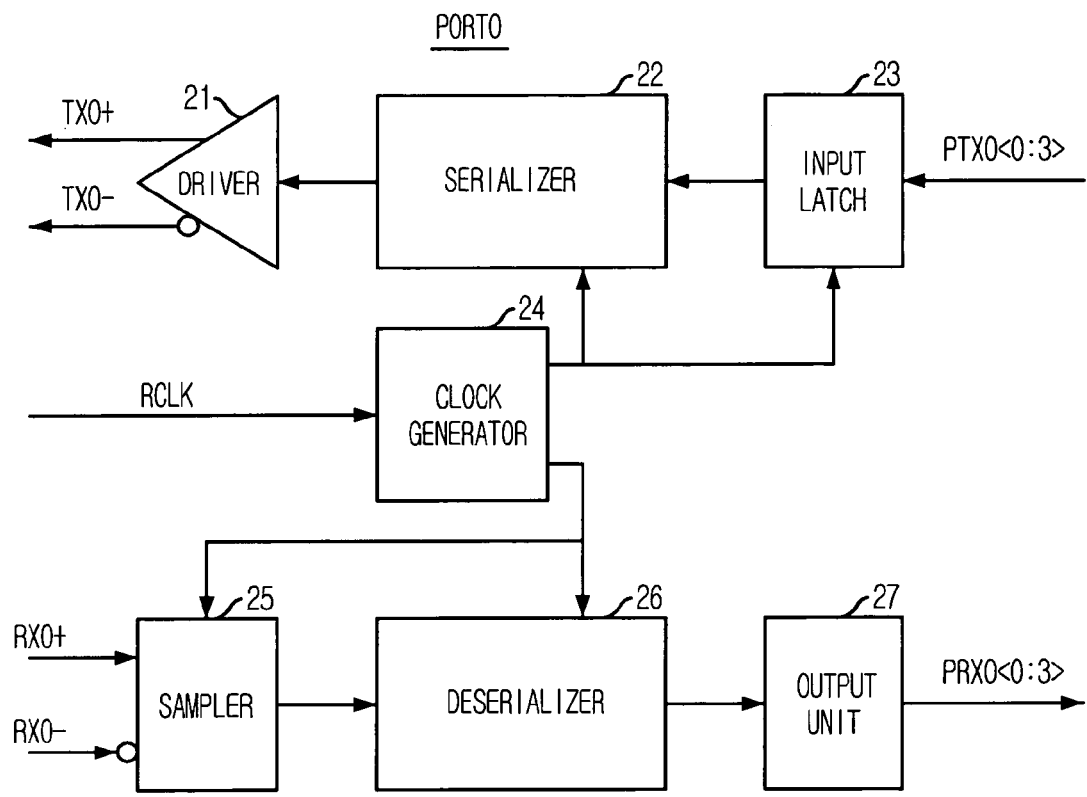
FIG. 2 is a block diagram of a port shown in FIG. 1.

As shown, the test parallel I/O controller 32A includes a test input signal transmitter 321A and a test output signal transmitter 322A. The test input signal transmitter 321A transmits the test input signal input through the test reception pads IN<0:3> to transmission bus, e.g., PTX0<0:3>. The test output signal transmitter 322A transmits the test output signal from reception bus, e.g., PRX0<0:3> to the test transmission pads OUT<0:3>. The test input signal transmitter 321A includes a receiver 3211A, an aligner 3212A, and a driver 3213A. The receiver 3211A receives the test input signal input from the external test device via the test reception pads IN<0:3>. The aligner 3212A aligns the test input signal from the receiver 3211A in synchronism with an internal clock ICLK. The internal clock ICLK generated by the clock generator 24 is shown in FIG. 2. The clock generator can be implemented with a phase locked loop (PLL) and a delay locked loop (DLL). The driver 3213A outputs the test input signal aligned by the aligner 3212A to the transmission bus, e.g., PTX0<0:3>. The test output signal transmitter 322A includes a receiver 3221A, an aligner 3222A, and a driver 3223A. The receiver 3221A receives the test output data output from the port, e.g., PORT0, through the reception bus, e.g., RX0<0:3>. The aligner 3222A aligns the test output signal in synchronism with the internal clock ICLK. The driver 3223A outputs the test output signal aligned by the aligner 3222A to the test transmission pads OUT<0:3>.

During a normal operation mode, the port, e.g., PORT0, deserializes the serial input data signal and transmits the deserialized input data signal to the reception bus, e.g., PRX<0:3>. Also, the port, e.g., PORT0, serializes the data signal input through the transmission bus, e.g., PTX0<0:3>, and outputs as the serial output signal through the serial transmission I/O pads TX0+ and TX0−. During a port test mode, the port, e.g., PORT0, serializes the test input signal input through the transmission bus, e.g., PTX0<0:3> and outputs to the transmission pads TX0+ and TX0−. Further, the port, e.g., PORT0, serializes test transmission signals TXP0 and TXN0 selected by a selector, e.g., a first selector 33, and outputs to the reception bus, e.g., PRX<0:3>.

The first selector 33 selects one of the serial input data signals and the test transmission signals TXP0 and TXN0 and outputs as reception signals RXP0 and RXN0 in response to the test mode enable signal TMEN.

Figure 5:
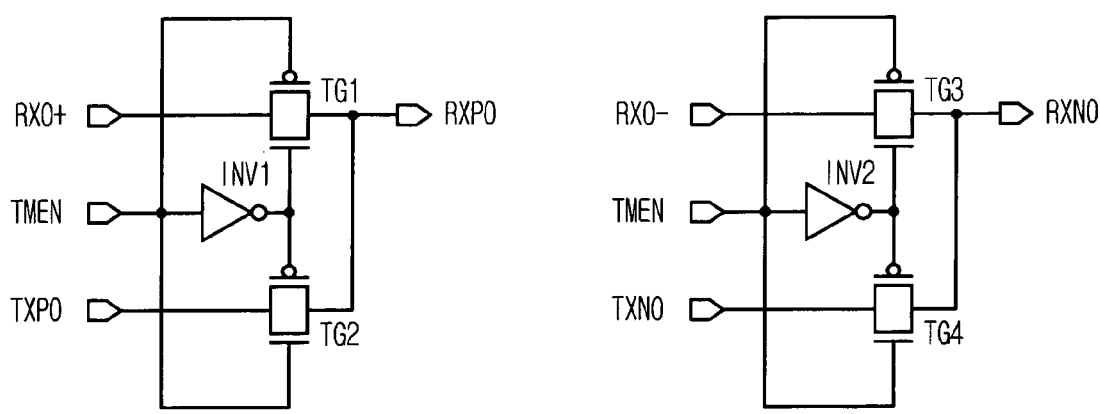
FIG. 5 is a schematic circuit diagram of a first selector shown in FIG. 3.

FIG. 5 is a schematic circuit diagram of the first selector 33 shown in FIG. 3.

As shown, the first selector 33A includes two inverters INV1 and INV2 and four transmission gates TG1, TG2, TG3, and TG4. During the port test mode, the test mode enable signal TMEN is activated as a logic high level. The second and the fourth transmission gates TG2 and TG4 turned on. Accordingly, the test transmission signals TXP0 and TXN0 are fed back as the reception signals RXP0 and RXN0 to the port PORT0. During a normal operation mode, the test mode enable signal TMEN is inactive as a logic low level and, therefore, the first and the third transmission gates TG1 and TG3 are turned on. Accordingly, the serial input data signal is fed back to the port PORT0 as the reception signal RXP0 and RXN0.

Figure 6:
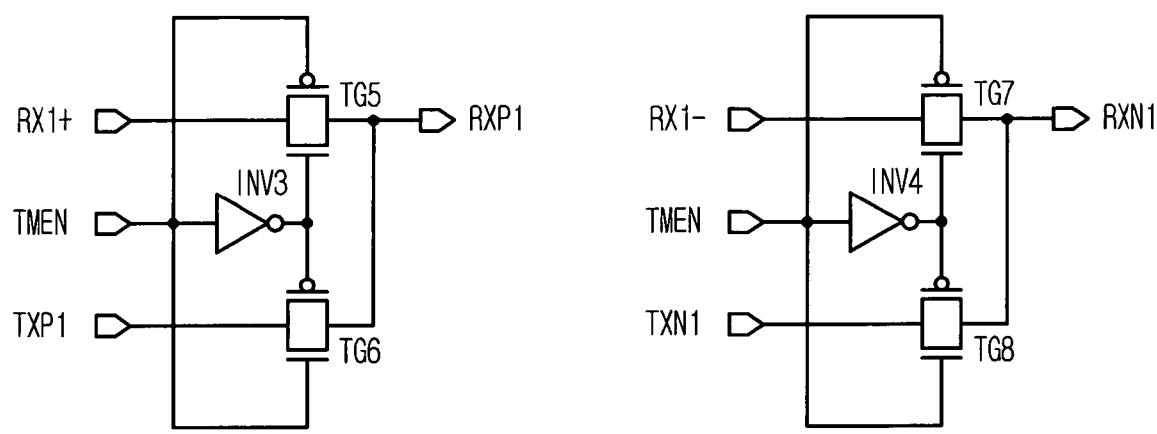
FIG. 6 is a schematic circuit diagram of a second selector shown in FIG. 3.

FIG. 6 is a schematic circuit diagram of a second selector 34 shown in FIG. 3.

As shown, the second selector 34 configured between the serial reception pads RX1+ and RX1− and the port PORT1 has the similar structure with the first selector 33A shown in FIG. 5. That is, the second selector 34 transmits test transmission signals TXP1 and TXN1 to the ports during the port test mode and transmits the serial input data signal input through serial reception I/O pads RX1+ and RX10 during the normal operation mode.

Meanwhile, each of the banks BANK0 to BANK3 respectively includes bank output drivers DRVP0 and DRVP1. The bank output drivers DRVP0 and DRVP1 are controlled not to transmit a data from the corresponding bank to the transmission bus, e.g., PTX0<0:3>, during the port test mode.

Figure 7:
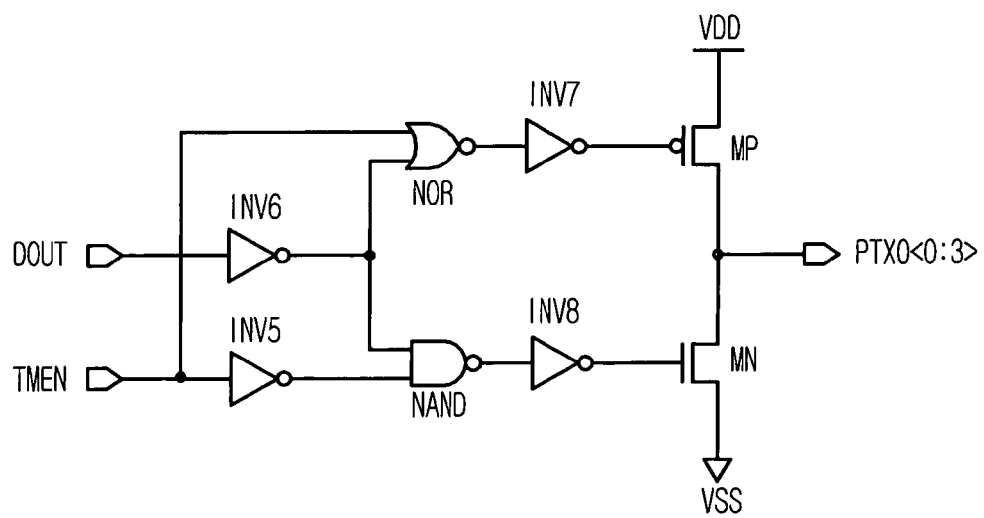
FIG. 7 is a schematic circuit diagram of a bank output driver shown in FIG. 3.

FIG. 7 is a schematic circuit diagram of the bank output driver DRVP0 shown in FIG. 3.

As shown, the bank output driver DRVP0 includes four inverters INV5 to INV8, a NOR gate NOR, a NAND gate NAND, a PMOS transistor MP, and an NMOS transistor MN. During the port test mode, the bank output driver DRVP0 is blocked to transmit the data DOUT from the corresponding bank to the transmission bus PTX0<0:3> in response to the test mode enable signal TMEN of the logic high level. Meanwhile, the bank output driver DRVP0 transmits the data DOUT to the transmission bus PTX0<0:3> in response to the test mode enable signal TMEN of the logic low level during the normal operation mode. The bank output driver DRVP0 shown in FIG. 7 is included for every bank in the semiconductor memory device. Another bank output driver DRVP1 included in the banks BANK0 to BANK3 has the similar structure to the bank output driver DRVP0.

Figure 8:
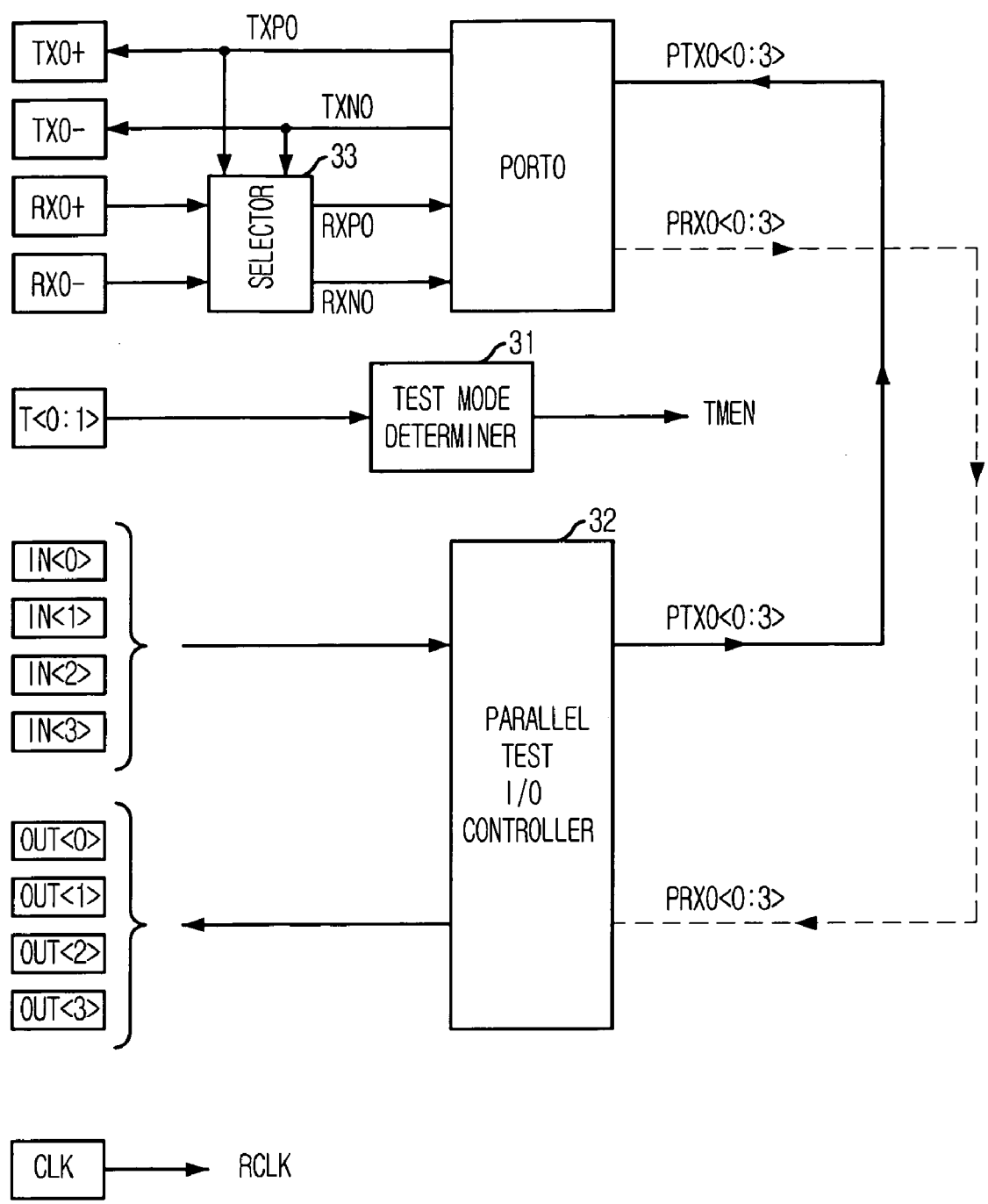
FIG. 8 is a schematic circuit diagram for explaining an operation of the semiconductor memory device during the port test mode.

FIG. 8 is a schematic circuit diagram for explaining an operation of the semiconductor memory device during the port test mode.

In case shown in FIG. 8, the semiconductor memory device tests an operation of the port PORT0. The test mode determiner 31 generates the test mode enable signal TMEN determining the operation mode of the semiconductor memory device based on a test mode control signal input through the test control pad T<0:1>. The test mode enable signal TMEN has a logic high level for the port test mode and has a logic low level for the normal operation mode.

During the normal operation mode, the parallel test I/O controller 32 is disabled in response to the test mode enable signal TMEN of the logic low level. The parallel test input signal input through the test reception pads IN<0:3> is not transmitted to the transmission bus PTX0<0:3>. The first selector 33 selects the serial input data signal input through the serial reception I/O pads RX0+ and RX0− and transmits as the reception signals RXP0 and RXN0 to the port PORT0 in response to the test mode enable signal TMEN of the logic low level. The port PORT0 samples the serial input data signal, deserializes the sampled input data signal, and transmits the desrialized input data signal to the reception bus PRX0<0:3>. Because the parallel test I/O controller 32 is disabled, the input data signal loaded at the reception bus PRX0<0:3> is not transmitted to the test transmission pads OUT<0:3> but only transmitted to a corresponding bank input driver RCVP0. The input data signal transmitted to the bank input driver RCVP0 in parallel is transmitted to a memory cell array in a core area of the semiconductor memory device.

Meanwhile, the input data signal output from the port, e.g., PORT0, can be transmitted to any banks BANK0 to BANK3 through the reception bus, e.g., PRX<0:3>. Therefore, it is required to designate a destination bank of the input data signal. To this end, the input data signal includes an additional bit, i.e., a bank data bit, for designating a corresponding destination bank. Though it is not described in the drawings, each of the ports PORT0 and PORT1 includes an additional circuit for decoding the bank data bit and each of the banks BANK0 to BANK3 includes a bank controller for determining whether the input signal data is valid for the corresponding bank.

Returning to FIG. 8, a data signal stored in the memory cell array in the corresponding bank is loaded at the transmission bus PTX0<0:3> through the bank output driver DRVP0. The data signal loaded to the transmission bus PTX0<0:3> is transmitted to the port PORT0. The port PORT0 serializes the data signal and outputs the serial data signal to the external device through the serial transmission I/O pads TX0+ and TX0−.

During the port test mode, the test mode determiner 31 outputs the test mode enable signal TMEN of the logic high level in response to the test mode control signal. The parallel test I/O controller 32 transmits the test input signal input through the test reception pads IN<0:3> to the transmission bus PTX0<0:33> in, parallel. The output driver DRV0 becomes a high impedance state in response to the test mode enable signal. Therefore, the signal from the cell area of the bank is not transmitted to the transmission bus PRX0<0:3>.

The port PORT0 receives and serializes the test input signal through the transmission bus PTX0<0:3> and outputs the serialized test input signal through the serial transmission I/O pads TX0+ and TX0−. The serialized test input signal output from the port PORT0 is also transmitted to the first selector 33 as the test transmission signals TXP0 and TXN0. The first selector 33 selects the test transmission signals TXP0 and TXN0 and outputs as the reception signals RXP0 and RXN0 in response to the test mode enable signal TMEN of the logic high level. The port PORT0 deserializes the reception signals RXP0 and RXN0 and transmits to the reception bus PRX0<0:3>. The reception signals RXP0 and RXN0 loaded at the reception bus PRX0<0:3> is input to the parallel test I/O controller 32. The parallel test I/O controller 32 outputs the reception signals RXP0 and RXN0 as the test output signal to the external test device through the test transmission pads OUT<0:3>. The external test device receiving the test output signal determines whether the port PORT0 operates correctly.

Figure 9:
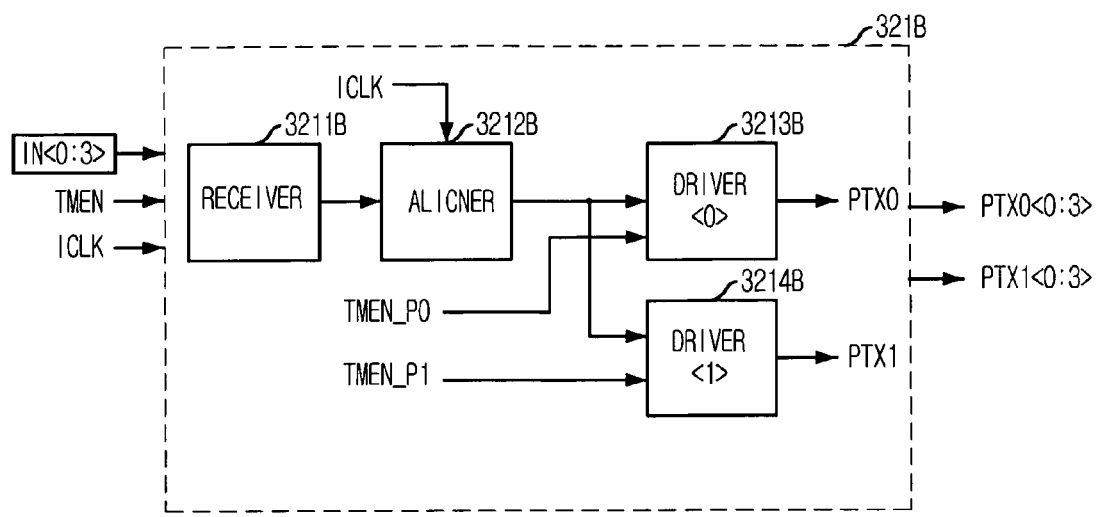
FIG. 9 is a block diagram of the parallel test I/O controller shown in FIG. 3 in accordance with another embodiment of the present invention.
Figure 9:
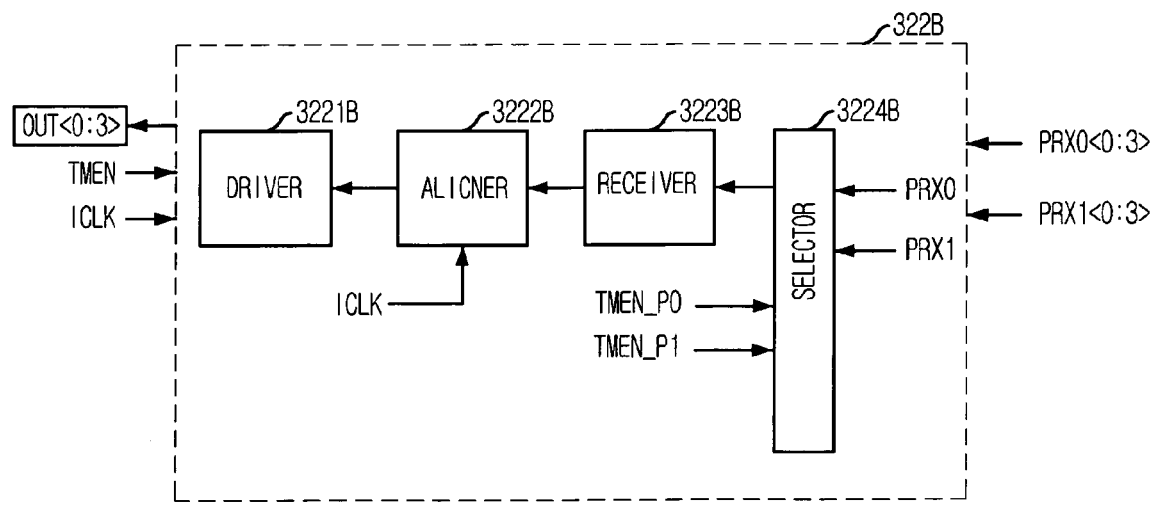

FIG. 9 is a block diagram of the parallel test I/O controller 32B shown in FIG. 3 in accordance with another embodiment of the present invention.

As shown, the parallel test I/O controller 32B includes a test input signal transmitter 321B and a test output signal transmitter 322B. The test input signal transmitter 321B transmits the test input signal input through the test reception pads IN<0:3> to transmission buses PTX0<0:3> and PTX1<0:3>. The test output signal transmitter 322B transmits the test output signal from reception buses PRX0<0:3> and PRX1<0:3> to the test transmission pads OUT<0:3>.

The test input signal transmitter 321B includes a receiver 3211B, an aligner 3212B, and a first and a second driver 3213B and 3214B. The receiver 3211B and the aligner 3212B are similar to the receiver 3211A and the aligner 3212A shown in FIG. 4. The number of drivers included in the test input signal transmitter 321B is corresponding to the number of ports included in the semiconductor memory device. The semiconductor memory device shown in FIG. 3 includes two ports PORT0 and PORT1. Accordingly, two drivers 3213B and 3214B are included in the test input signal transmitter 321B. The first and the second drivers 3213B and 3214B are respectively controlled by the port selection signals TMEN_P0 and TMEN_P1. The port selection signals TMEN_P0 and TMEN_P1 are generated based on test mode control signal input to test mode determiner 31 through the test control pad T<0:1>. In another embodiment, the port selection signals TMEN_P0 and TMEN_P1 can be generated by using test signals input from the external test device.

The test output signal transmitter 322B includes a driver 3221B, an aligner 3222B, and a receiver 3223B. The test output signal transmitter 322B further includes a selector 3224B. The driver 3221B, the aligner 3222B, and the receiver 3223B are similar to those shown in FIG. 4. The selector 3224B selects one of the signals input through the reception buses PRX0<0:3> and PRX1<0:3> in response to the port selection signals TMEN_P0 and TMEN_P1. For example, when the first port selection signal TMEN_P0 is a logic low level, the selector 3224B selects the signal input through the first reception bus PRX0<0:3>.

Figure 10:
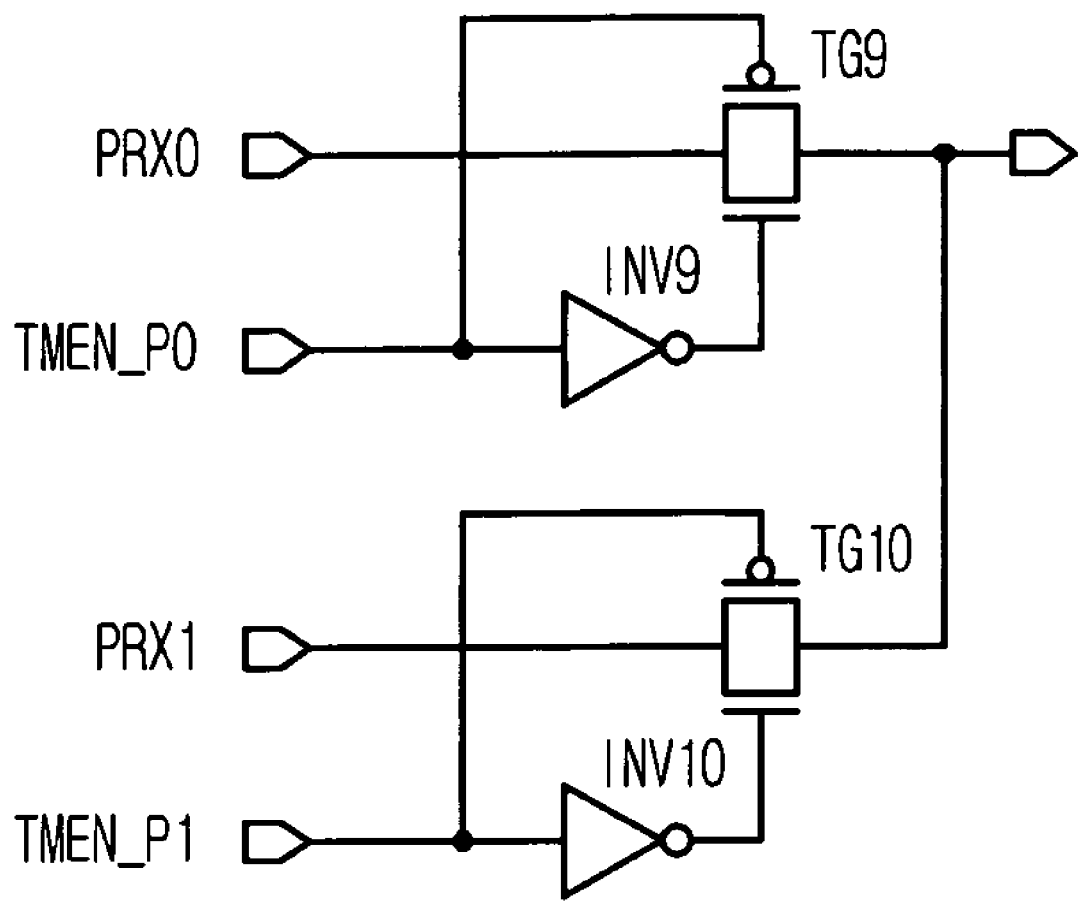
FIG. 10 is a schematic circuit diagram of a selector shown in FIG. 9.

FIG. 10 is a schematic circuit diagram of the selector 3224B shown in FIG. 9.

As shown, the selector 3224B includes two transmission gates TG9 and TG10. The ninth transmission gate TG9 transmits the signal input through the first reception bus PRX0<0:3> in response to the first port selection signal TMEN_P0 of the logic low level. The tenth transmission gate TG10 transmits the signal input through the second reception bus PRX1<0:3> in response to the second port selection signal TMEN_P1 of the logic level.

Figure 11:
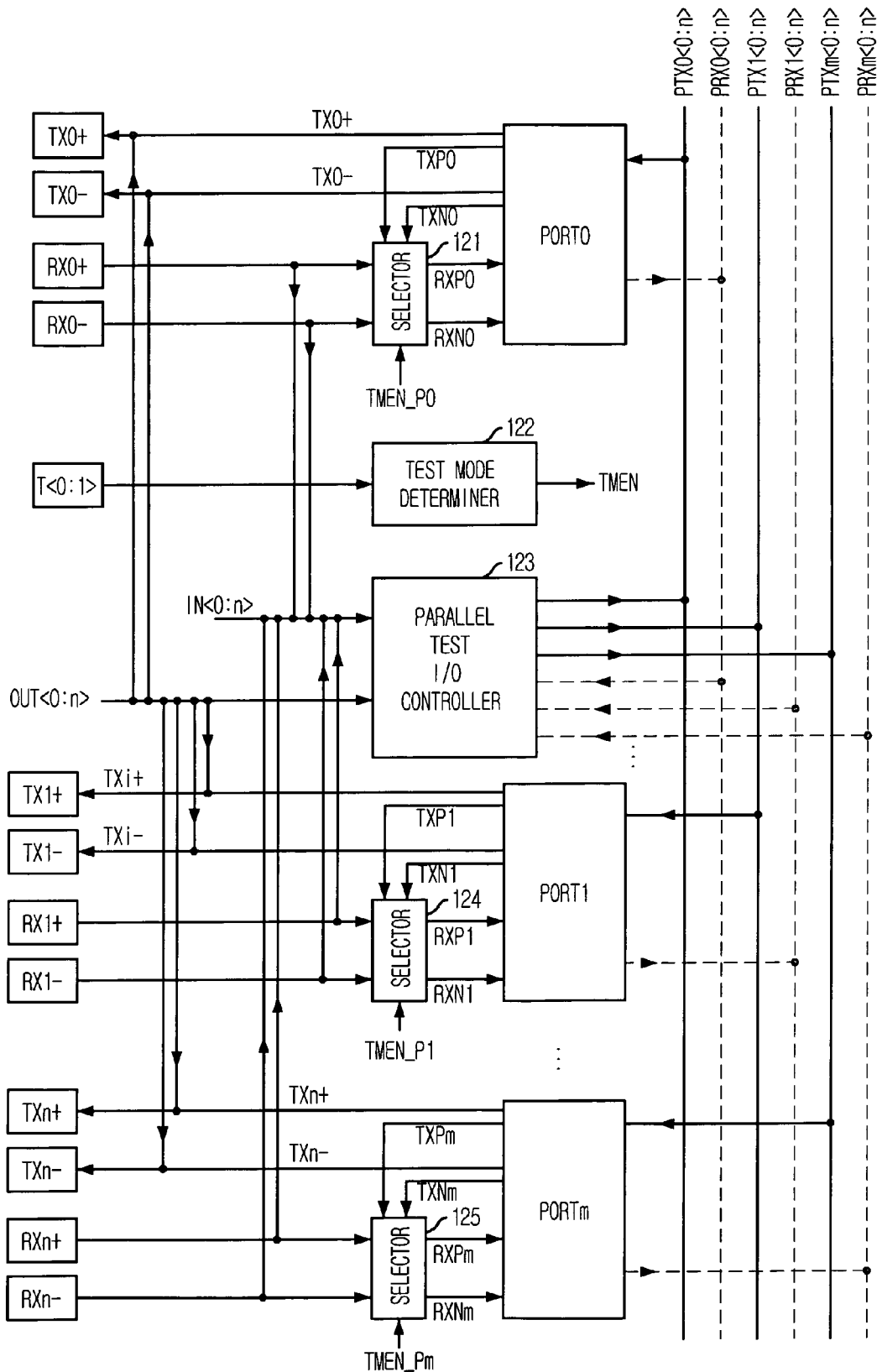
FIG. 11 is a block diagram of the semiconductor memory device in accordance with sill another embodiment of the present invention.

FIG. 11 is a block diagram of the semiconductor memory device in accordance with still another embodiment of the present invention.

Comparing to the semiconductor memory device shown in FIG. 3, the semiconductor memory device shown in FIG. 11 commonly uses the serial I/O pads, e.g., TX0+, TX0−, RX0+, and RX0−, for the normal operation mode and the port test mode. That is, the semiconductor memory device uses the serial transmission I/O pads, e.g., TX0+ and TX0−, instead of the test transmission pads OUT<0:3> and uses the serial reception I/O pads, e.g., RX0+ and RX0−, instead the test reception pads IN<0:3> during the port test mode. Accordingly, the number of I/O pads included in the semiconductor memory device is reduced and the internal circuitry of the ports, e.g., PORT0, is changed as described below. The other constituents shown in FIG. 11 such as a test mode determiner 122, a parallel test I/O controller 123, global buses, e.g., PTX0<0:n>, and a plurality of selectors are similar to those shown in FIG. 3.

Figure 12:
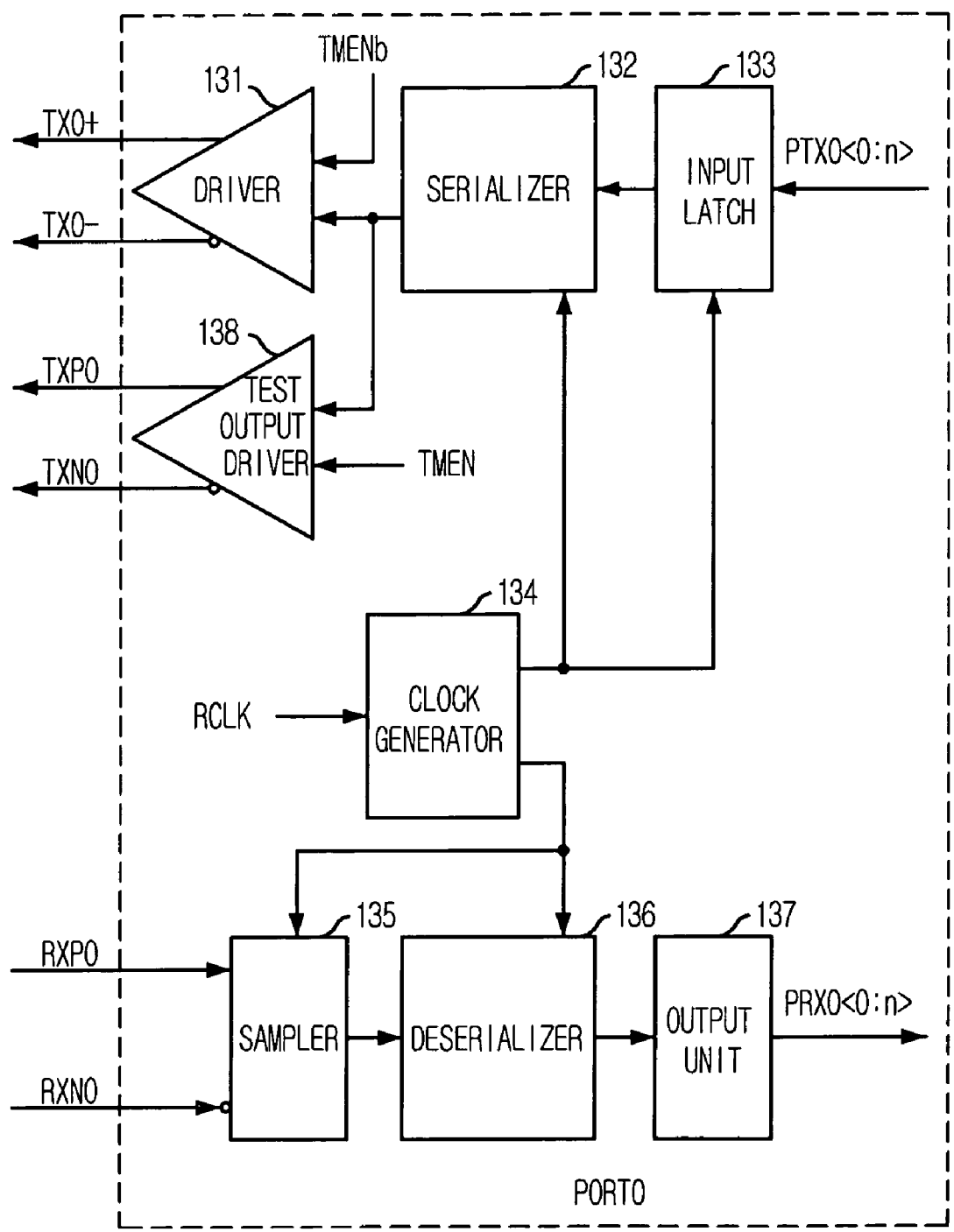
FIG. 12 is a block diagram of a port shown in FIG. 11.

FIG. 12 is a block diagram of the port PORT0 shown in FIG. 11.

The port, e.g., PORT0, outputs the transmission signals to the serial transmission I/O pads, e.g., TX0+ and TX0−, during the normal operation mode and outputs the test transmission signals TXP0 and TXN0 to the selector 121 during the port test mode. As shown in FIG. 12, the port PORT0 includes a test output driver 138 in addition to the blocks shown in FIG. 2. That is, a driver 131, a serializer 132, an input latch 133, a clock generator 134, a sampler 135, a deserializer 136, and an output unit 137 are similar to those shown in FIG. 2. The test output driver 138 transmits the test transmission signals TXP0 and TXN0 from the serializer 132 to the selector 121 in series during the port test mode in response to the test mode enable signal TMEN of a logic high level. Meanwhile, the driver 131 transmits the transmission signal in response to an inverted test mode enable signal TMENb. The inverted test mode enable signal TMENb has an opposite phase with the test mode enable signal TMEN. During the port test mode, the driver 131 becomes a high impedance state in response to the inverted test mode enable signal of a logic low level and does not transmit the transmission signal to the transmission I/O pads TX0+ and TX0−. Every port shown in FIG. 11 has the similar structure with that shown in FIG. 12.

The operation of the semiconductor memory device shown in FIG. 11 is described below. A test mode control signal is input through the test control pad T<0:3>. The test mode determiner 122 decides the operation mode of the semiconductor memory device by generating the test mode enable signal TMEN in response to the test mode control signal. The test mode control signal has a logic high level for the port test mode and has a logic low level for the normal operation mode.

During the normal operation mode, the parallel test I/O controller 123 is disabled by the test mode enable signal TMEN of a logic low level. Accordingly, external signals input through the serial reception I/O pads, e.g., RX0+ and RX0−, are not transmitted to the reception buses, e.g., PRX0<0:n>. The external signals are input to the selector, e.g., 121. The selector 121 receiving the external signals and serial test signals TXP0 and TXN0 selects the external signals in response to the first port selection signal TMEN_P0 of a logic low level and transmits the external signals as the reception signals RXP0 and RXN0 to the first port PORT0. The first port PORT0 samples and deserializes the reception signals RXP0 and RXN0 and, then, transmits to the reception bus PRX0<0:n>. Because the parallel test I/O controller 123 is disabled, the reception signals RXP0 and RXN0 loaded at the reception bus PRX0<0:n> are not transmitted to the parallel test I/O controller 123 but only transmitted to a corresponding bank input driver RCVP0. The reception signals RXP0 and RXN0 transmitted to the bank input driver RCVP0 in parallel are transmitted to a memory cell array in a core area of the semiconductor memory device. Meanwhile, the signal output from the port PORT0 can be transmitted to any banks BANK0 to BANK3 through the reception bus, e.g., PRX<0:3>. Therefore, the port PORT0 determines the destination bank for the reception signals RXP0 and RXN0. Meanwhile, a data signal stored in the memory cell array in the corresponding bank is loaded at the transmission bus PTX0<0:n> through the bank output driver DRVP0. The data signal loaded to the transmission bus PTX0<0:n> is transmitted to the port PORT0. The port PORT0 serializes the data signal and outputs the serial data signal to the external device through the serial transmission I/O pads TX0+ and TX0−.

During the port test mode, the test mode determiner 122 outputs the test mode enable signal TMEN of a logic high level in response to the test mode control signal. The parallel test I/O controller 123 transmits a test input signal input through the serial reception I/O pads, e.g., RX0+ and RX0−, to the transmission bus PTX0<0:n> in parallel. The output driver DRV0 included in the banks becomes a high impedance state in response to the test mode enable signal TMEN and, accordingly, does not transmit data signal from the bank to the transmission bus PTX0<0:n>. The port PORT0 serializes the test input signal input through the transmission bus PTX0<0:n> and outputs the serialized test input signal as the test transmission signals TXP0 and TXN0 to the first selector 121 through the test output driver 138 shown in FIG. 12. The first selector 121 receiving the test transmission signals TXP0 and TXN0 and the external input signal input through the serial reception I/O pads RX0+ and RX0− selects the test transmission signals TXP0 and TXN0 in response to the port selection signal of the logic low level. The port PORT0 deserializes the reception signals RXP0 and RXN0 and transmits to the reception bus PRX0<0:n>. The reception signals RXP0 and RXN0 loaded at the reception bus PRX0<0:n> is input to the parallel test I/O controller 123.

The parallel test I/O controller 123 outputs the reception signals RXP0 and RXN0 as the test output signal to the external test device through the serial transmission I/O pads TX0+ and TX0−. The external test device receiving the test output signal determines whether the port PORT0 operates correctly.

Figure 13:
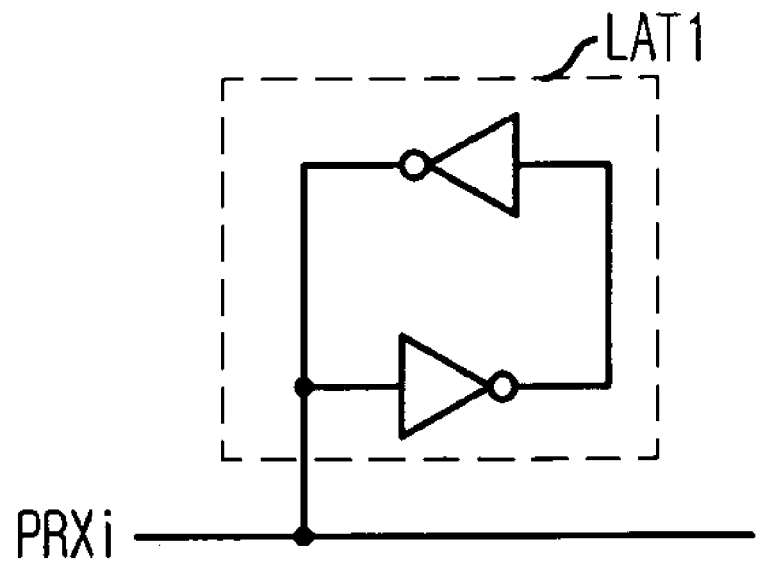
FIG. 13 is a schematic circuit diagram of a latch connected to the global data lines of the present invention.
Figure 13:
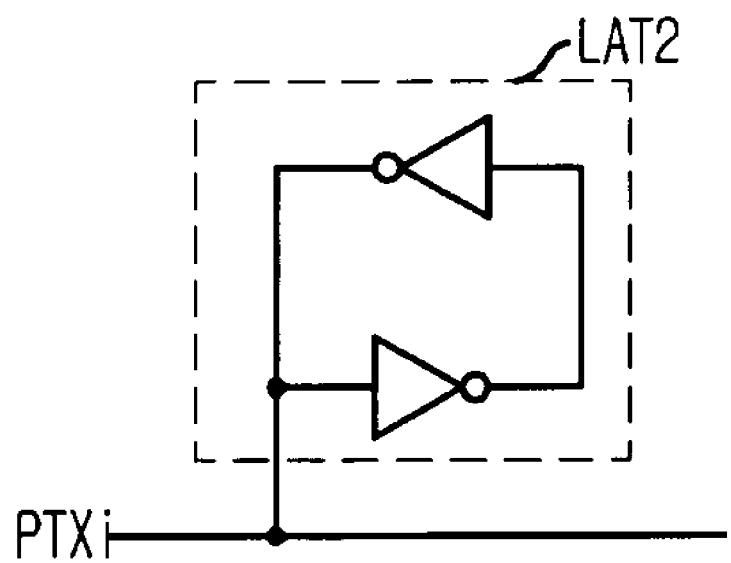

FIG. 13 is a schematic circuit diagram of a latch connected to the global data lines of the present invention. The latch is used for reliable data transmission.

The semiconductor memory device of the present invention including several ports in order to perform a data communication with external devices makes it possible to reliably detect an operation error of the ports. Further, the semiconductor memory device can test the ports for converting the parallel/serial data regardless of the fault of the DRAM core in the banks The present application contains subject matter related to Korean patent application Nos. 2005-90917 and 2006-32946, filed in the Korean Patent Office on Sep. 29, 2005 and on Apr. 11, 2006, the entire contents of which is incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
   a plurality of ports configured to perform a serial input/output (I/O) data communication with external devices;
   a plurality of banks configured to perform a parallel I/O data communication with the ports;
   a global data bus configured to transmit signals between the banks and the ports;
   a test mode determiner configured to determine an operation mode of the semiconductor memory device by generating a test mode enable signal in response to a test mode control signal;
   a test I/O controller configured to transmit and receive a test signal with the ports in response to the test mode enable signal during a port test mode; and
   a plurality of selectors, each of which is configured to receive the test signal output from a corresponding port in series and feed back the test signal to the corresponding port.

2. The semiconductor memory device as recited in claim 1, wherein the operation mode includes the port test mode for testing an operation of the ports and a normal operation mode for data communication between the external devices and the banks.

3. The semiconductor memory device as recited in claim 2, wherein the global data bus includes:
   a first data bus for transmitting a first signal from the ports to the banks; and
   a second data bus for transmitting a second signal from the banks to the ports.

4. The semiconductor memory device as recited in claim 3, further comprising:
   a plurality of first pads configured to serve the serial I/O data communication; and
   a plurality of second pads configured to serve the parallel I/O data communication.

5. The semiconductor memory device as recited in claim 4, wherein each of the first pads includes:
   a first reception pad for receiving an external input signal in series and transmitting the received external input signal to the selector; and
   a first transmission pad for receiving an output signal output from the ports in series and outputting the received output signal to the external devices.

6. The semiconductor memory device as recited in claim 5, wherein each of the ports serializes the test signal transmitted through the second data bus and transmits the serialized test signal to the first transmission pad during the port test mode.

7. The semiconductor memory device as recited in claim 6, wherein the selectors, receiving the serialized test signal provided from the ports and the external input signal input through the first reception pad, selects the serialized test signal in response to the test mode enable signal during the port test mode.

8. The semiconductor memory device as recited in claim 7, wherein each of the second pads includes:
   a second reception pad for receiving the test signal in parallel and transmits the received test signal to the test I/O controller; and
   a second transmission pad for transmitting the test signal output from the test I/O controller to the external devices.

9. The semiconductor memory device as recited in claim 8, wherein the test I/O controller transmits the test signal input through the second reception pad to the second data bus in response to the test mode enable signal.

10. The semiconductor memory device as recited in claim 8, wherein the test I/O controller transmits the test signal from the ports through the first data bus to the second transmission pad in response to the test mode enable signal.

11. The semiconductor memory device as recited in claim 8, wherein the test I/O controller includes:
    a test signal input unit for transmitting the test signal input through the second reception pad to the second data bus in response to the test mode enable signal; and
    a test signal output unit for transmitting the test signal from the ports through the first data bus to the second transmission pad in response to the test mode enable signal.

12. The semiconductor memory device as recited in claim 11, wherein test signal input unit includes:
    a receiver for receiving the test signal through the second reception pad;
    an aligner for aligning the test signal from the receiver in synchronism with an internal clock; and
    a driver for transmitting the test signal from the aligner to the second data bus.

13. The semiconductor memory device as recited in claim 12, wherein the internal clock has substantially the same phase as an external clock.

14. The semiconductor memory device as recited in claim 12, wherein the internal clock is generated by modifying a phase and a period of an external clock.

15. The semiconductor memory device as recited in claim 11, wherein the test signal output unit includes:
    a receiver for receiving the test signal through the first data bus;
    an aligner for aligning the test signal from the receiver in synchronism with an internal clock; and
    a driver for transmitting the test signal from the aligner to the second transmission pad.

16. The semiconductor memory device as recited in claim 15, wherein the internal clock has substantially the same phase as an external clock.

17. The semiconductor memory device as recited in claim 15, wherein the internal clock is generated by modifying a phase and a period of an external clock.

18. The semiconductor memory device as recited in claim 17, wherein each of the ports deserializes the test signal input from one of the selectors and transmits the deserialized test signal to the first data bus in parallel during the port test mode.

19. The semiconductor memory device as recited in claim 18, wherein each of the ports includes:
   a sampler for sampling the test signal input from the selector;
   a deserializer for deserializing the test signal sampled by the sampler;
   an output unit for transmitting the deserialized test signal to the first data bus;
   a latch unit for latching the test signal transmitted through the second data bus in parallel;
   a serializer for serializing the test signal latched in the latch unit; and
   a driver for outputting the serialized test to the first transmission pad.

20. The semiconductor memory device as recited in claim 19, wherein the port further includes a clock generator configured to generate an internal clock for controlling I/O timing of the ports.

21. The semiconductor memory device as recited in claim 20, wherein the clock generator generates the internal clock based on an external reference clock.

22. The semiconductor memory device as recited in claim 3, wherein each of the banks includes an output driver for preventing the second signal from being transmitted to the second data bus in response to the test mode enable signal during the port test mode.

23. The semiconductor memory device as recited in claim 22, wherein the output driver is in a high impedance state in response to the test mode enable signal during the port test mode.

24. The semiconductor memory device as recited in claim 22, wherein the output driver transmits the second signal to the second data bus during the normal operation mode.

25. The semiconductor memory device as recited in claim 4, wherein the test mode control signal is input through one of the second pads.

26. The semiconductor memory device as recited in claim 4, wherein the test mode control signal is input through one of the first pads.

27. The semiconductor memory device as recited in claim 4, further comprising a third pad for receiving the test mode control signal.

28. The semiconductor memory device as recited in claim 3, wherein the ports have the same number of data lines as the first data bus allocated thereto.

29. The semiconductor memory device as recited in claim 3, wherein the ports have the same number of data lines as the second data bus allocated thereto.

30. A semiconductor memory, comprising:
   a plurality of first pads configured to provide a serial input/output (I/O) data communication;
   a plurality of second pads configured to provide a parallel I/O data communication;
   a plurality of ports configured to perform the serial I/O data communication with external devices;
   a plurality of banks configured to perform the parallel I/O data communication with the ports;
   a first data bus configured to transmit a first signal from the ports to the banks;
   a second data bus configured to transmit a second signal from the banks to the ports;
   a test mode determiner configured to generate a test mode enable signal and a port selection signal in response to a test mode control signal;
   a test I/O controller configured to transmit and receive a test signal with the ports in response to the test mode enable signal during a port test mode; and
   a plurality of selectors, each of which is configured to receive the test signal output from a corresponding port in series and feedback the test signal to the corresponding port in response to the port selection signal.

31. The semiconductor memory device as recited in claim 30, wherein each of the first pads includes:
   a first reception pad for receiving an external input signal in series and transmitting the received external input signal to one of the selectors; and
   a first transmission pad for receiving an output signal output from the port in series and outputting the received output signal to the external devices.

32. The semiconductor memory device as recited in claim 31, wherein each of the ports serializes the test signal transmitted through the second data bus and transmits the serialized test signal to the first transmission pad during the port test mode.

33. The semiconductor memory device as recited in claim 32, wherein each of the selectors, receiving the test signal provided from the ports and the external input signal input through the first reception pad, selects the test signal in response to the port selection signal during the port test mode.

34. The semiconductor memory device as recited in claim 31, wherein each of the second pads includes:
   a second reception pad for receiving the test signal in parallel and transmitting the received test signal to the test I/O controller; and
   a second transmission pad for transmitting the test signal output from the test I/O controller to the external devices.

35. The semiconductor memory device as recited in claim 34, wherein the test I/O controller transmits the test signal input through the second reception pad to the second data bus in response to the test mode enable signal.

36. The semiconductor memory device as recited in claim 34, wherein the test I/O controller transmits the test signal from the ports through the first data bus to the second transmission pad in response to the test mode enable signal.

37. The semiconductor memory device as recited in claim 34, wherein the test I/O controller includes:
   a test signal input unit for transmitting the test signal input through the second reception pad to the second data bus in response to the test mode enable signal; and
   a test signal output unit for transmitting the test signal from the ports through the first data bus to the second transmission pad in response to the test mode enable signal.

38. The semiconductor memory device as recited in claim 37, wherein the test signal input unit includes:
   a receiver for receiving the test signal through the second reception pad;
   an aligner for aligning the test signal from the receiver; and
   a driver for transmitting the test signal from the aligner to the second data bus.

39. The semiconductor memory device as recited in claim 31, wherein the port serializes the test signal input from the test I/O controller through the second data bus and transmits the serialized test signal to the first transmission pad during the port test mode.

40. The semiconductor memory device as recited in claim 30, wherein each of the ports deserializes the test signal input from one of the selectors and transmits the deserialized test signal to the first data bus in parallel during the port test mode.

41. The semiconductor memory device as recited in claim 40, wherein each of the ports includes:
   a sampler for sampling the test signal input from the one selector;
   a deserializer for deserializing the test signal sampled by the sampler;
   an output unit for transmitting the deserialized test signal to the first data bus;
   a latch unit for latching the test signal transmitted through the second data bus in parallel;
   a serializer for serializing the test signal latched in the latch unit; and
   a driver for outputting the serialized test signal to the first transmission pad.

42. The semiconductor memory device as recited in claim 41, wherein each of the ports further includes a clock generator configured to generate an internal clock for controlling I/O timing of the port.

43. The semiconductor memory device as recited in claim 42, wherein the clock generator generates the internal clock based on an external reference clock.

44. The semiconductor memory device as recited in claim 31, wherein the banks include an output driver for preventing the second signal from being transmitted to the second data bus in response to the test mode enable signal during the port test mode.

45. The semiconductor memory device as recited in claim 44, wherein the output driver is in a high impedance state in response to the test mode enable signal during the port test mode.

46. The semiconductor memory device as recited in claim 44, wherein the output driver transmits the second signal to the second data bus during a normal operation mode.

47. The semiconductor memory device as recited in claim 31, wherein the test mode control signal is input through one of the second pads.

48. The semiconductor memory device as recited in claim 31, wherein the test mode control signal is input through one of the first pads.

49. The semiconductor memory device as recited in claim 31, further comprising a third pad for receiving the test mode control signal.

50. The semiconductor memory device as recited in claim 31, wherein each of the ports has the same number of data lines as the first data bus allocated thereto.

51. The semiconductor memory device as recited in claim 31, wherein each of the ports has the same number of data lines as the second data bus allocated thereto.

52. A semiconductor memory device, comprising:
   a plurality of pads configured to provide a serial input/output (I/O) data communication;
   a plurality of ports configured to perform the serial I/O data communication with external devices;
   a plurality of banks configured to perform a parallel I/O data communication with the ports;
   a first data bus configured to transmit a first signal from the ports to the banks;
   a second data bus configured to transmit a second signal from the banks to the ports;
   a test mode determiner configured to generate a test mode enable signal in response to a test mode control signal;
   a test I/O controller configured to transmit a test signal input through the pads to the second data bus and transmit the test signal input through the first data bus to the pads in response to the test mode enable signal during a port test mode; and
   a plurality of selectors, each of which is configured to receive the test signal output from a corresponding port in series and feed back the test signal to the corresponding port in response to the test mode enable signal.

53. The semiconductor memory device as recited in claim 52, wherein each of the pads includes:
   a reception pad for transmitting an external input signal to one of the selectors in series; and
   a transmission pad for transmitting a serial output signal from the ports to the external devices.

54. The semiconductor memory device as recited in claim 53, wherein each of the ports serializes the test signal input through the second data bus and transmits the serialized test signal to the transmission pad during the port test mode.

55. The semiconductor memory device as recited in claim 54, wherein each of the selectors, receiving the serialized test signal provided from the ports and the external input signal input through the reception pad, selects the serialized test signal in response to the test mode enable signal during the port test mode.

56. The semiconductor memory device as recited in claim 55, wherein the test I/O controller transmits the test signal input through the reception pad to the second data bus in response to the test mode enable signal.

57. The semiconductor memory device as recited in claim 55, wherein the test I/O controller transmits the test signal from the ports through the first data bus to the transmission pad in response to the test mode enable signal.

58. The semiconductor memory device as recited in claim 55, wherein the test I/O controller includes:
   a test signal input unit for transmitting the test signal input through the reception pad to the second data bus in response to the test mode enable signal; and
   a test signal output unit for transmitting the test signal from the ports through the first data bus to the transmission pad in response to the test mode enable signal.

59. The semiconductor memory device as recited in claim 58, wherein the test signal input unit includes:
   a receiver for receiving the test signal through the reception pad;
   an aligner for aligning the test signal from the receiver in synchronism with an internal clock; and
   a driver for transmitting the test signal from the aligner to the second data bus.

60. The semiconductor memory device as recited in claim 59, wherein the internal clock has substantially the same phase as an external clock.

61. The semiconductor memory device as recited in claim 59, wherein the internal clock is generated by modifying a phase and a period of an external clock.

62. The semiconductor memory device as recited in claim 58, wherein the test signal output unit includes:
   a receiver for receiving the test signal through the first data bus;
   an aligner for aligning the test signal from the receiver in synchronism with an internal clock; and
   a driver for transmitting the test signal from the aligner to the transmission pad.

63. The semiconductor memory device as recited in claim 62, wherein the internal clock has substantially the same phase as an external clock.

64. The semiconductor memory device as recited in claim 62, wherein the internal clock is generated by modifying a phase and a period of an external clock.

65. The semiconductor memory device as recited in claim 53, wherein each of the ports serializes the test signal input from the test I/O controller through the second data bus and transmits the serialized test signal to the transmission pad during the port test mode.

66. The semiconductor memory device as recited in claim 52, wherein each of the ports deserializes the test signal input from one of the selectors and transmits the deserialized test signal to the first data bus in parallel during the port test mode.

67. The semiconductor memory device as recited in claim 66, wherein each of the ports includes:
 a sampler for sampling the test signal input from the one selector;
 a deserializer for deserializing the test signal sampled by the sampler;
 an output unit for transmitting the deserialized test signal to the first data bus;
 a latch unit for latching the test signal transmitted through the second data bus in parallel;
 a serializer for serializing the test signal latched in the latch unit; and
 a driver for outputting the serialized test signal to the transmission pad.

68. The semiconductor memory device as recited in claim 67, wherein each of the ports further includes a clock generator configured to generate an internal clock for controlling I/O timing of the port.

69. The semiconductor memory device as recited in claim 68, wherein the clock generator generates the internal clock based on an external reference clock.

70. The semiconductor memory device as recited in claim 52, wherein the banks include an output driver for preventing the second signal from being transmitted to the second data bus in response to the test mode enable signal during the port test mode.

71. The semiconductor memory device as recited in claim 70, wherein the output driver is in a high impedance state in response to the test mode enable signal during the port test mode.

72. The semiconductor memory device as recited in claim 71, wherein the output driver transmits the second signal to the second data bus during a normal operation mode.

73. The semiconductor memory device as recited in claim 52, wherein each of the ports has the same number of data lines as the first data bus allocated thereto.

74. The semiconductor memory device as recited in claim 52, wherein each of the ports has the same number of data lines as the second data bus allocated thereto.

75. A semiconductor memory device, comprising:
 a plurality of pads configured to provide a serial input/output (I/O) data communication;
 a plurality of ports configured to perform the serial I/O data communication with external devices;
 a plurality of banks configured to perform a parallel I/O data communication with the ports;
 a first data bus configured to transmit a first signal from the ports to the banks;
 a second data bus configured to transmit a second signal from the banks to the ports;
 a test mode determiner configured to generate a test mode enable signal and a port selection signal in response to a test mode control signal;
 a test I/O controller configured to transmit a test signal input through the pads to the second data bus and transmit the test signal input through the first data bus to the pads in response to the test mode enable signal during a port test mode; and
 a plurality of selectors, each of which is configured to receive the test signal output from a corresponding port in series and feed back the test signal to the corresponding port in response to the port selection signal.

76. The semiconductor memory device as recited in claim 75, wherein each the pads includes:
 a reception pad for transmitting an external input signal to one of the selectors in series; and
 a transmission pad for transmitting a serial output signal from the ports to the external devices.

77. The semiconductor memory device as recited in claim 76, wherein each of the ports serializes the test signal input through the second data bus and transmits the serialized test signal to the transmission pad during the port test mode.

78. The semiconductor memory device as recited in claim 77, wherein the selector, receiving the serialized test signal provided from the port and the external input signal input through the reception pad, selects the serialized test signal in response to the port selection signal during the port test mode.

79. The semiconductor memory device as recited in claim 78, wherein the test I/O controller transmits the test signal input through the reception pad to the second data bus in response to the test mode enable signal.

80. The semiconductor memory device as recited in claim 79, wherein the test I/O controller transmits the test signal from the ports through the first data bus to the transmission pad in response to the test mode enable signal.

81. The semiconductor memory device as recited in claim 78, wherein the test I/O controller includes:
 a test signal input unit for transmitting the test signal input through the reception pad to the second data bus in response to the test mode enable signal; and
 a test signal output unit for transmitting the test signal from the ports through the first data bus to the transmission pad in response to the test mode enable signal.

82. The semiconductor memory device as recited in claim 81, wherein the test signal input unit includes:
 a receiver for receiving the test signal through the reception pad;
 an aligner for aligning the test signal from the receiver; and
 a driver for transmitting the test signal from the aligner to the second data bus.

83. The semiconductor memory device as recited in claim 81, wherein the test signal output unit includes:
 a receiver for receiving the test signal through the first data bus;
 an aligner for aligning the test signal from the receiver; and
 a driver for transmitting the test signal from the aligner to the transmission pad.

84. The semiconductor memory device as recited in claim 76, wherein each of the ports serializes the test signal input from the test I/O controller through the second data bus and transmits the serialized test signal to the transmission pad during a normal operation mode and to the selector during the port test mode.

85. The semiconductor memory device as recited in claim 76, wherein each of the ports deserializes the test signal input from one of the selectors and transmits the deserialized test signal to the first data bus in parallel during the port test mode.

86. The semiconductor memory device as recited in claim 85, wherein each of the ports includes:
- a sampler for sampling the test signal input from the one selector;
- a deserializer for deserializing the test signal sampled by the sampler;
- an output unit for transmitting the deserialized test signal to the first data bus;
- a latch unit for latching the test signal transmitted through the second data bus in parallel;
- a serializer for serializing the test signal latched in the latch unit;
- a driver for outputting the serialized test signal to the transmission pad during the normal operation mode; and
- a test driver for outputting the serialized test signal to the selector during the port test mode.

87. The semiconductor memory device as recited in claim 86, wherein each of the ports further includes a clock generator configured to generate an internal clock for controlling I/O timing of the port.

88. The semiconductor memory device as recited in claim 87, wherein the clock generator generates the internal clock based on an external reference clock.

89. The semiconductor memory device as recited in claim 75, wherein the banks include an output driver for preventing the second signal from being transmitted to the second data bus in response to the test mode enable signal during the port test mode.

90. The semiconductor memory device as recited in claim 89, wherein the output driver is in a high impedance state in response to the test mode enable signal during the port test mode.

91. The semiconductor memory device as recited in claim 90, wherein the output driver transmits the second signal to the second data bus during the normal operation mode.

* * * * *